United States Patent
Laurila et al.

(10) Patent No.: US 10,634,434 B2
(45) Date of Patent: Apr. 28, 2020

(54) ARRANGEMENT FOR COOLING A CLOSED CABINET

(71) Applicant: ABB Technology OY, Helsinki (FI)

(72) Inventors: Risto Laurila, Espoo (FI); Tero Viitanen, Vantaa (FI); Bruno Agostini, Zurich (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/246,207

(22) Filed: Aug. 24, 2016

(65) Prior Publication Data
US 2017/0059253 A1 Mar. 2, 2017

(30) Foreign Application Priority Data
Aug. 26, 2015 (EP) .................................. 15182471

(51) Int. Cl.
*F28D 15/02* (2006.01)
*F25D 3/06* (2006.01)
(Continued)

(52) U.S. Cl.
CPC .............. *F28D 15/025* (2013.01); *F25D 3/06* (2013.01); *F28D 15/0275* (2013.01);
(Continued)

(58) Field of Classification Search
CPC ................. F28D 15/025; F28D 15/275; F28D 2015/0216; F25D 3/06; F28F 1/022; F28F 1/32
See application file for complete search history.

(56) References Cited

U.S. PATENT DOCUMENTS

| 4,600,050 A | 7/1986 | Noren |
| 7,096,928 B2 * | 8/2006 | Phillips ................. F28D 15/025 |
| | | 165/104.21 |

(Continued)

FOREIGN PATENT DOCUMENTS

| CN | 101377392 A | 3/2009 |
| CN | 201218682 Y | 4/2009 |

(Continued)

OTHER PUBLICATIONS

European Search Report, EP15182471, ABB Techndlogy OY, dated Feb. 9, 2016.
(Continued)

*Primary Examiner* — Gordon A Jones
(74) *Attorney, Agent, or Firm* — Taft Stettinius & Hollister LLP; J. Bruce Schelkopf

(57) ABSTRACT

An arrangement for cooling a closed, sealed cabinet (1), comprising a thermosiphon heat exchanger (2) disposed inside the cabinet (1) and having an evaporator (3) and a condenser (4) for circulating a working fluid between the evaporator (3) and the condenser (4) in a closed loop, wherein the working fluid evaporated in the evaporator (3) by heat flows to the condenser (4) for cooling and the condensed working fluid flows back to the evaporator (3). The evaporator (3) is exposed to hot air flow generated inside the cabinet (1), and a heat transfer element (5) is attached to the condenser (3) in a sealed manner through a cabinet wall (6) for transferring heat to the outside of the cabinet (1).

16 Claims, 4 Drawing Sheets

(51) Int. Cl.
*F28F 1/02* (2006.01)
*F28F 1/32* (2006.01)
*F28F 9/02* (2006.01)

(52) U.S. Cl.
CPC ............... *F28F 1/022* (2013.01); *F28F 1/32* (2013.01); *F28F 9/0243* (2013.01); *F28D 2015/0216* (2013.01)

(56) References Cited

U.S. PATENT DOCUMENTS

| | | | | |
|---|---|---|---|---|
| 8,405,992 | B2* | 3/2013 | Yesin | H01L 23/427 165/104.33 |
| 8,582,298 | B2* | 11/2013 | Facusse | H05K 7/20809 165/104.33 |
| 2006/0000582 | A1* | 1/2006 | Phillips | F28D 15/025 165/104.21 |
| 2008/0218980 | A1* | 9/2008 | Tracewell | H05K 7/20672 361/713 |
| 2011/0048676 | A1 | 3/2011 | Toyoda et al.ke | |
| 2013/0228313 | A1* | 9/2013 | Fried | F28D 15/0266 165/104.26 |
| 2016/0018139 | A1* | 1/2016 | Olsson | F25B 21/02 62/3.3 |

FOREIGN PATENT DOCUMENTS

| | | |
|---|---|---|
| CN | 101876517 A | 11/2010 |
| CN | 102318457 A | 1/2012 |
| CN | 102573407 A | 7/2012 |
| EP | 2031332 B2 | 9/2010 |
| EP | 2444770 A1 | 4/2012 |
| EP | 2552182 A1 | 1/2013 |
| EP | 2568790 A1 | 3/2013 |
| EP | 2587907 A1 | 5/2013 |
| JP | 08078589 | 3/1996 |

OTHER PUBLICATIONS

Chinese Office Action dated Apr. 27, 2018; Chinese Application No. 201610720723.8; ABB Technology Oy; 18 pgs. (including translation).

* cited by examiner

ARRANGEMENT FOR COOLING A CLOSED CABINET

FIELD OF THE INVENTION

The invention relates to an arrangement for cooling a closed, sealed cabinet, comprising a thermosiphon heat exchanger disposed inside the cabinet and having an evaporator and a condenser for circulating a working fluid between the evaporator and the condenser in a closed loop, wherein the working fluid evaporated in the evaporator by heat flows to the condenser for cooling and the condensed working fluid flows back to the evaporator.

DESCRIPTION OF PRIOR ART

Now different heat exchangers, utilizing customer cooling fluids, are used for closed cabinet cooling, but there is always a risk of leakage of the cooling fluid. Also different cooling fluids and pressure levels make it difficult to utilize economical and long life cooling solutions for closed cabinet cooling.

SUMMARY OF THE INVENTION

An object of the present invention is to provide an arrangement to solve the above problems. The objects of the invention are achieved by an arrangement which is characterized by that the evaporator is exposed to hot air flow generated inside the cabinet, and that a heat transfer element is attached to the condenser in a sealed manner through a cabinet wall for transferring heat to the outside of the cabinet. The preferred embodiments of the invention are disclosed in the dependent claims.

The invention is based on the idea, where heat energy is transferred from a high "Ingress Protection (IP) Rated" space to another, possibly also IP Rated space through a heat exchanger which resembles the construction of a Compact Thermosyphon Heat Exchanger (COTHEX) having closed cooling system, but now used in a reversed manner. Hot air circulated through the evaporator starts the "bubble pump" operation inside MPE (MultiPort Extruded) tubes, preferably used in the heat exchanger of the invention, and the bubbles transfer heat energy to the condenser and to its heat transfer element which then further transfers the heat energy to whatsoever cooling system or media connected to it.

The invention is extremely useful in cases where two different IP spaces must be solid/homogenous without any went-throughs. A practical example is EX Cabinet (Explosion Proof Cabinet) where the inner and outer spaces must be kept separated. The invention helps in cooling of the interior of the EX Cabinet and transfers the heat energy to a contact surface of the cabinet which then can be cooled further by e.g. liquid cooling. This way there is no went-throughs through the cabinet wall, but the interior of the cabinet is cooled very effectively. This also enables very easy installation and maintenance of the arrangement of the invention.

One important use for the invention is e.g. internal cooling of inverter modules, thus enabling totally sealed IP module structure and cooling by a single and same cooling media. The heat exchanger (COTHEX) now used in reversed manner transfers heat dissipated by the electronics etc. to the same thermal surface where IGBT (Insulated Gate Bipolar Transistor) modules normally are assembled to.

For using two-phase cooling for heat exchange there are several advantages compared to conventional solutions. This system can be better optimized and is more cost efficient. For heat exchange point of view, typically restricted area is air-side heat transfer rate and by using two-phase principle, heat exchange in air-side is possible to increase almost without any area limit to get air-side cooling working optimally, because evaporation is happening in constant temperature.

Thermosiphon heat exchangers which can be used in a reversed manner for the arrangement according to the invention, are disclosed e.g. in documents EP 2 031 332 B1, EP 2 444 770 A1, EP 2 568 790 A1 and EP 2 587 907 A1.

BRIEF DESCRIPTION OF THE DRAWINGS

In the following the invention will be described in greater detail by means of preferred embodiments with reference to the attached drawings, in which.

DETAILED DESCRIPTION OF THE INVENTION

Figure 1:
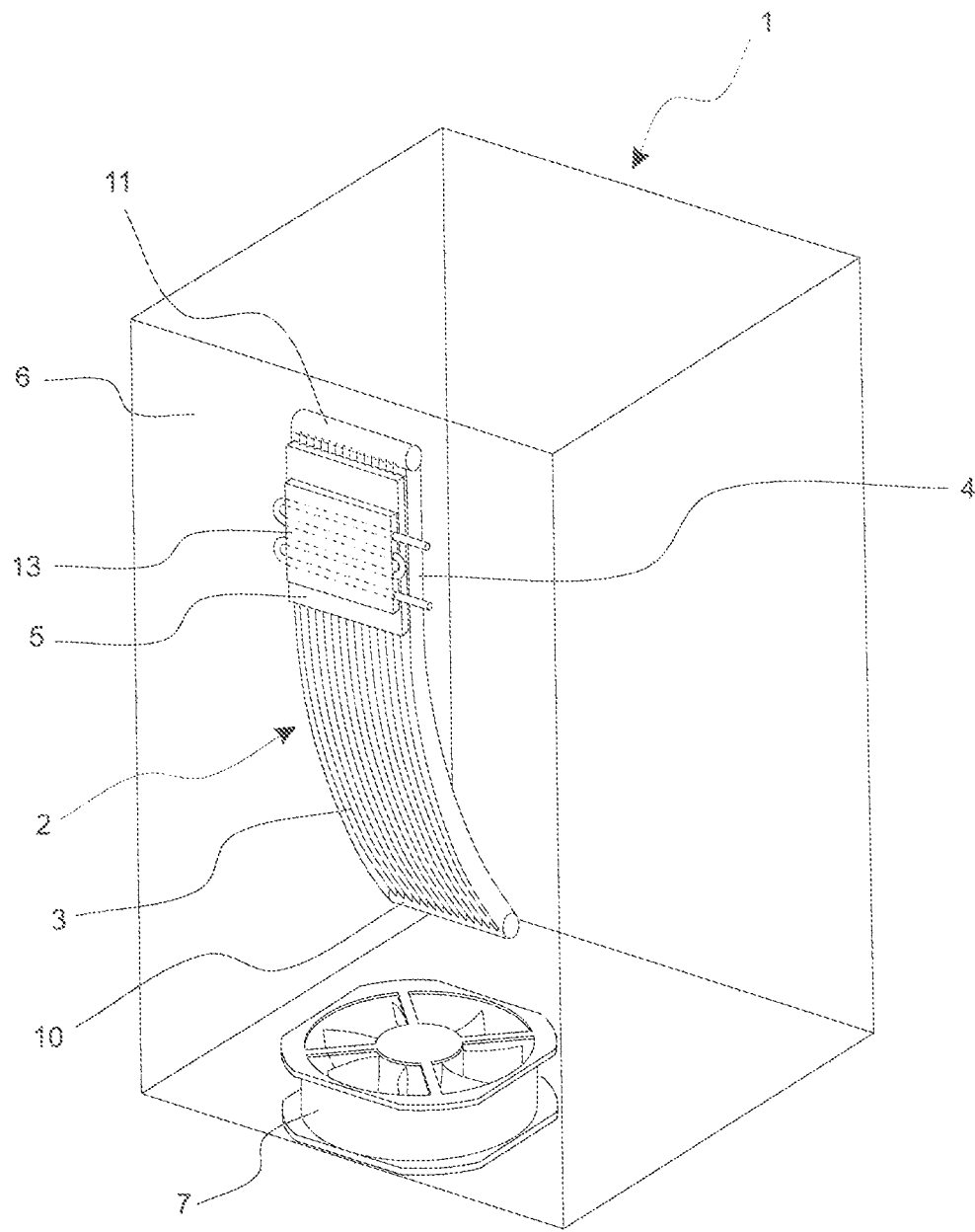
FIG. 1 illustrates an embodiment of the present invention in a perspective view.
Figure 2:
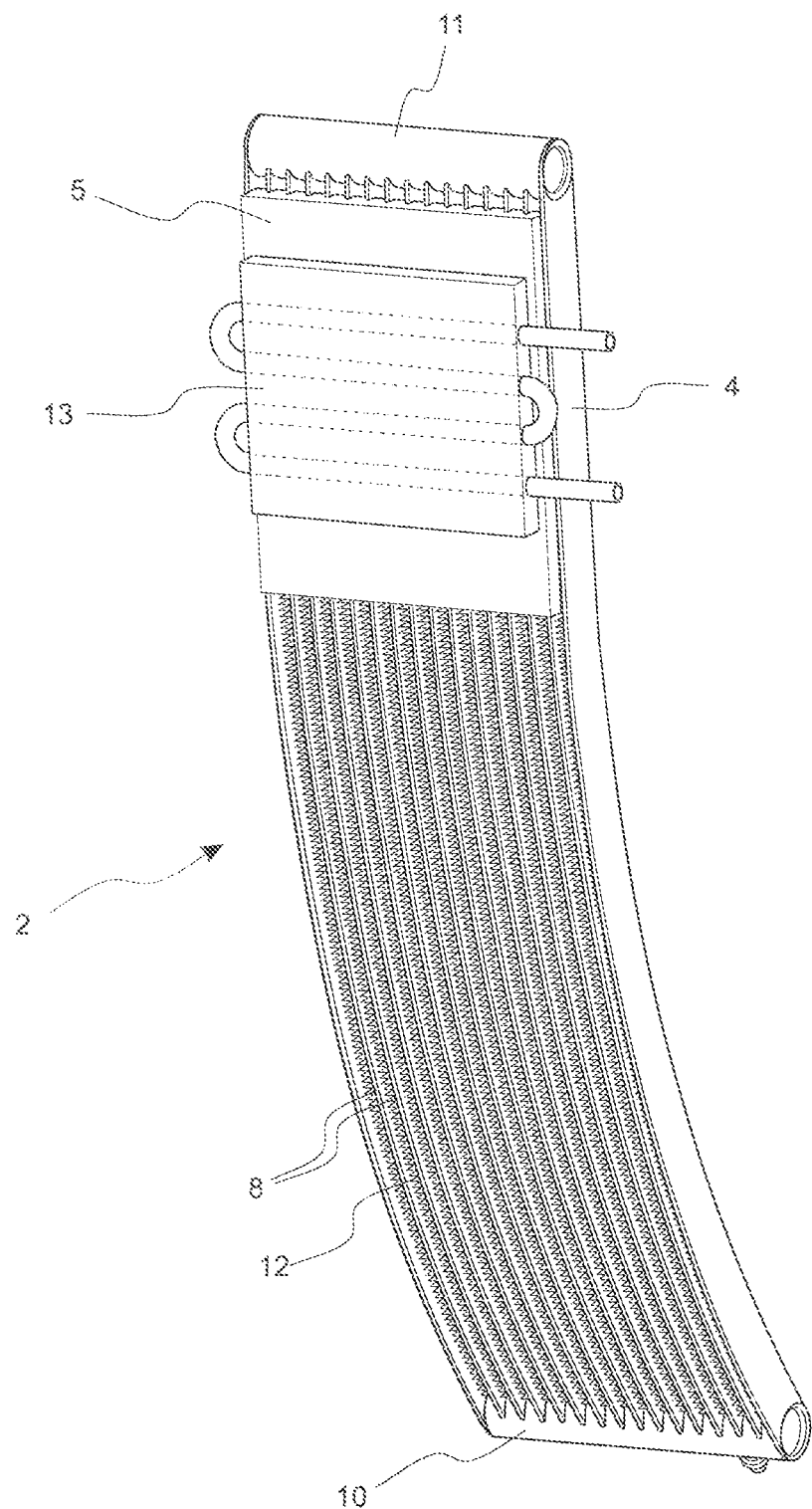
FIG. 2 illustrates the heat exchanger shown in FIG. 1 separately in the same perspective view.
Figure 3:
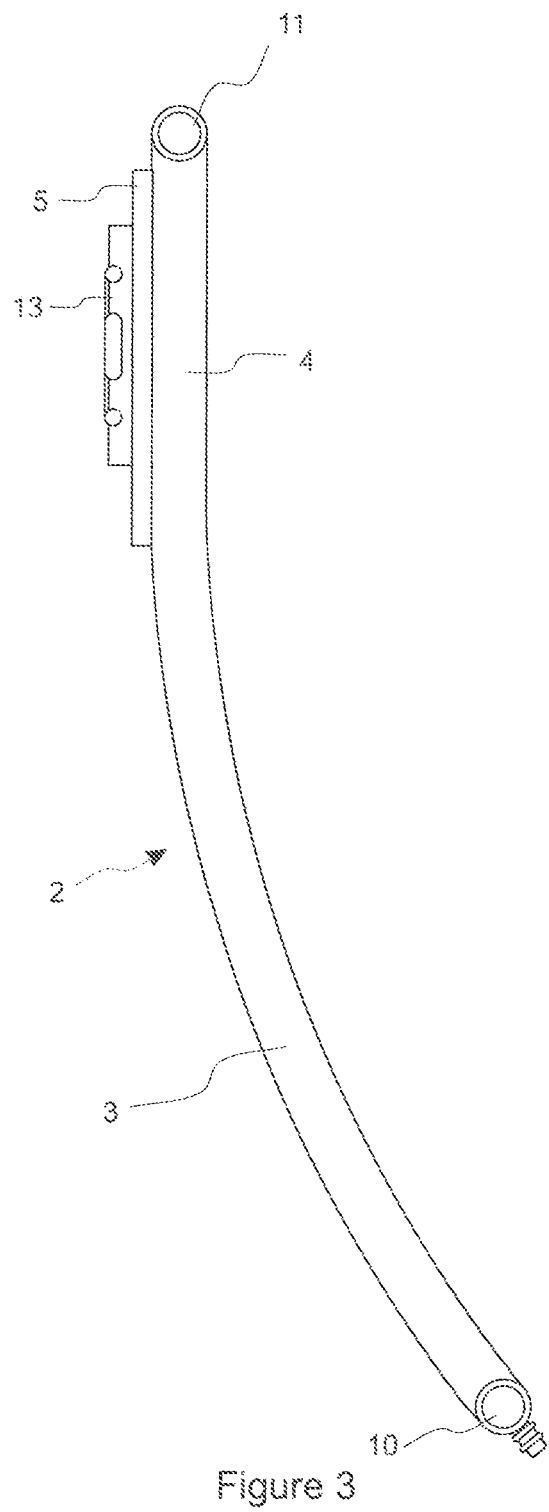
FIG. 3 illustrates the heat exchanger of FIGS. 1 and 2 in a side view and attached to a wall of a sealed cabinet.
Figure 4:
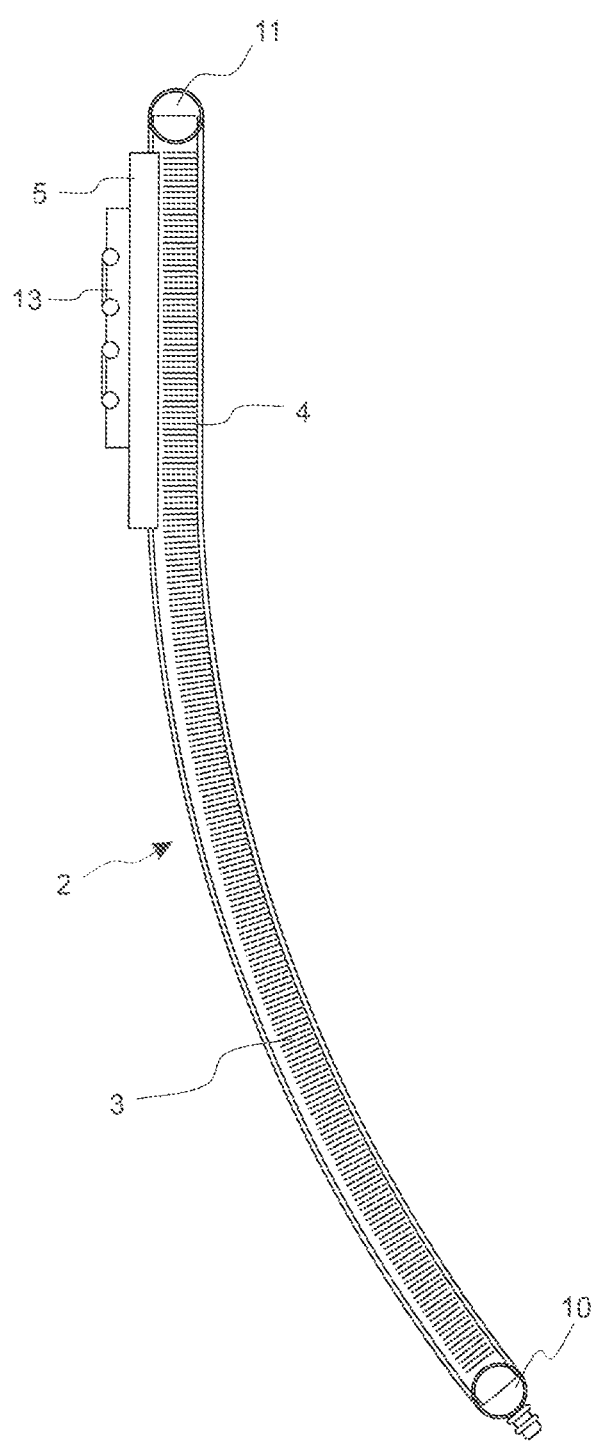
FIG. 4 illustrates the heat exchanger of FIGS. 1 to 3 in a cross-sectional side view and attached to a wall of a sealed cabinet.

The arrangement according to FIG. 1 shows a closed, sealed IP cabinet 1, the inside of which must be cooled. For that purpose a thermosiphon heat exchanger 2 is disposed inside the cabinet 1.

The heat exchanger 2 according to FIGS. 1 to 4 comprises an evaporator 3 (an evaporator end) and a condenser 4 (a condenser end) for circulating a working fluid between the evaporator 3 and the condenser 4 in a closed loop, wherein the working fluid evaporated in the evaporator 3 by heat flows to the condenser 4 for cooling and the condensed working fluid flows back to the evaporator 3.

The evaporator 3 is exposed to hot air flow generated inside the cabinet 1, and a heat transfer element 5 is attached to the condenser 4 in a sealed manner through a cabinet wall 6 for transferring heat to the outside of the cabinet 1.

The heat exchanger 2 of this example is based on gravity heat pipe principle, wherein the condenser 4 is above the evaporator 3. Further, the heat exchanger 2 is curved, so that the evaporator curves towards the interior of the cabinet 1. Under the curved evaporator 3 a fan 7 is disposed for directing hot air generated in the cabinet 1 towards the evaporator 3.

Figure 6:
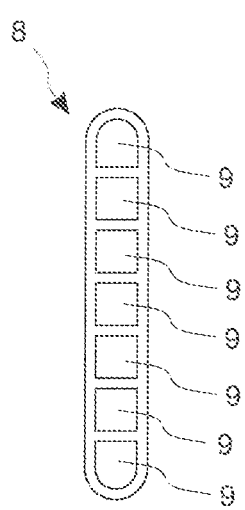
FIG. 6 illustrates a cross-sectional view of one fluid conduit which can be used in the heat exchanger of FIGS. 1 to 5.

Typically the heat exchanger 2 of this type comprises parallel fluid conduits 8, each fluid conduit including plurality of flow channels 9 (FIG. 6) for the working fluid. The ends of the fluid conduits 8 are connected by manifolds 10 and 11 at both ends, respectively. A least one of channels 9 on the heat transfer element side is for evaporated working fluid and at least one channel 9 on the opposite side is for condensed working fluid. The conduits 8 are spaced from each other allowing thereby free air flow through the evaporator 3, and the exteriors of the conduits 8 are provided with fins 12 for enhanced heat absorbtion. The principle of the closed working fluid circulation is known e.g. from EP 2 031 332 B1.

The heat transfer element 5 is partially embedded between the conduits 8 and in longitudinal (vertical) direction it covers about 30% of the length of the heat exchanger 2 and the rest, about 70%, of the heat exchanger length is curved as mentioned above.

In this embodiment a liquid cooled heat sink 13 is attached to an exterior surface of the heat transfer element 5 for removing heat from the heat exchanger 2 and thereby from the cabinet 1 and simultaneously causing condensation of the working fluid. It would also be possible that the heat transfer element 5 includes a liquid cooled heat sink (not shown in the Figures). Also another thermosiphon heat exchanger could be attached to the exterior surface of the heat transfer element 5 (not shown in the Figures). Even a conventional air cooled heat sink could be attached to an exterior surface of the heat transfer element or included to the heat transfer element (not shown in the Figures). This alternative could require additional fan cooling. However, when choosing the cooling in the outside of the cabinet 1, selected cooling method is not restricted to a certain solution.

The heat exchanger for use in the arrangement according to the invention can be based on Pulsating Heat Pipe (PHP) principle as well, but also used in a reversed manner as in its original use. The PHP heat exchanger has a construction resembling the construction of a Compact Thermosyphon Heat Exchanger (COTHEX). However, the channels have capillary dimensions and the connecting parts of the fluid conduits are provided with fluid distribution elements that conduct fluid from predetermined channels between the different groups of channels. This makes it possible to have the heat exchanger work as a pulsating heat pipe. In such a solution, oscillations occur in a small channel loop heat pipe due to the bidirectional expansion of vapour inside the channels. During operation, the liquid slugs and elongated vapour bubbles will oscillate between a cold and a hot region because of hydrodynamic instabilities caused by the rapid expansion of the bubbles confined in the small channels, and thus provide a fluid velocity almost independent of gravity. Consequently, this type of heat exchanger (not shown in the Figures, but known e.g. in EP 2 444 770 A1) works in any orientation (with some performance changes depending on the orientation, however). There is no preferred flow direction due to the occurrence of the periodic oscillations and, therefore, no need for a riser and a downcomer. Therefore, there is necessarily no need to arrange the heat exchanger so that the condenser is above the evaporator. The evaporator and the condenser can be e.g. adjacent to each other, e.g. essentially on the same level.

Figure 5:
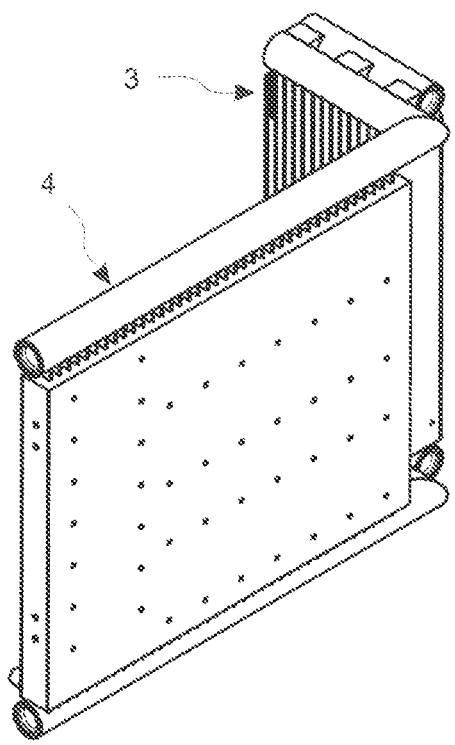
FIG. 5 illustrates one alternative for the heat exchanger.

The heat exchanger also can be angled, as disclosed e.g. in EP 2 587 907 A1, but again, used in a reserved manner as in its original use. The orientation that type of heat exchanger can be so that the condenser is on a higher level than the evaporator, but also so that the evaporator 3 and the condenser 4 are adjacent to each other, e.g. essentially on the same level as shown in FIG. 5.

It is to be understood that the above description and the accompanying figures are only intended to illustrate the present invention. It will be obvious to a person skilled in the art that the invention can be varied and modified within the scope of the claims without departing from the scope of the invention.

The invention claimed is:

1. An arrangement for cooling a closed, sealed cabinet, comprising
    a thermosiphon heat exchanger disposed inside the cabinet and having an evaporator and a condenser both inside the cabinet for circulating a working fluid between the evaporator and the condenser in a closed loop,
    wherein the working fluid evaporated in the evaporator by heat flows to the condenser for cooling and the working fluid condensed in the condenser flows back to the evaporator,
    wherein,
    the evaporator is exposed to hot air flow generated inside the cabinet, conduits of the evaporator being parallel to each other and spaced from each other with fins being disposed between the conduits to form passages extending through the evaporator transversely to the conduits, the fins extending across a space between adjacent conduits of the conduits such that each of the passages is defined by two of the adjacent conduits and two adjacent fins of the fins ends of the conduits being connected by manifolds at the ends of the conduits, and the evaporator being axially curved to form an arc, wherein the hot air flow passes through the passages to pass through the evaporator from one side of the evaporator to another side of the evaporator, and that
    a heat transfer element is attached to the condenser in a sealed manner through a cabinet wall for transferring heat to outside of the cabinet.

2. The arrangement according to claim 1, wherein the heat exchanger functions on a gravity heat pipe principle.

3. The arrangement according to claim 1, wherein the heat exchanger functions on a pulsating heat pipe principle.

4. The arrangement according to claim 1, wherein the condenser is above the evaporator.

5. The arrangement according to claim 1, wherein the evaporator and the condenser are adjacent to each other and on the same level.

6. The arrangement according to claim 1, wherein each conduit of the conduits includes a plurality of flow channels for the working fluid.

7. The arrangement according to claim 1, which further comprises a fan for directing hot air generated in the cabinet towards the evaporator.

8. The arrangement according to claim 1, which further comprises a liquid cooled heat sink attached to an exterior surface of the heat transfer element.

9. The arrangement according to claim 1, wherein the heat transfer element includes a liquid cooled, heat sink.

10. The arrangement according to claim 1, which further comprises an evaporator of another thermosiphon heat exchanger attached to an exterior surface of the heat transfer element.

11. The arrangement according to claim 1, which further comprises an air cooled heat sink attached to an exterior surface of the heat transfer element.

12. The arrangement according to claim 1, wherein the heat transfer element includes an air cooled heat sink.

13. The arrangement according to claim 1, wherein the entire length of the evaporator is curved along the axial length.

14. The arrangement according to claim 1, wherein the passages of the evaporator are oriented at different angles relative to each other.

15. An arrangement for cooling a closed, sealed cabinet, comprising a thermosiphon heat exchanger disposed inside the cabinet and having an evaporator and a condenser both inside the cabinet for circulating a working fluid between the evaporator and the condenser in a closed loop, wherein the working fluid evaporated in the evaporator by heat flows to the condenser for cooling and the working fluid condensed in the condenser flows back to the evaporator, wherein, the evaporator is, exposed to hot air flow generated inside the cabinet, conduits of the evaporator being parallel to each other and spaced from each other with fins being disposed between the conduits to form passages extending through the evaporator transversely to the conduits, the fins extending across a space between adjacent conduits of the conduits such that each of the passages is defined by two of the adjacent conduits and two adjacent fins of the fins, wherein the hot air flow passes through the passages to pass through the evaporator from one side of the evaporator to another side of the evaporator, wherein the evaporator is axially curved to form an arc, the passages thereby being oriented at different angles relative to each other along an axial length, wherein each conduit of the conduits includes a plurality of flow channels for the working fluid, and wherein ends of the conduits are connected by manifolds at the ends of the conduits, respectively, and that a fan is disposed in the cabinet for directing hot air generated in the cabinet towards the evaporator, a heat transfer element is attached to the condenser in a sealed manner through a cabinet wall for transferring heat to outside of the cabinet.

16. The arrangement according to claim 1, wherein one end of the conduits comprises the evaporator and another end of the conduits comprises the condenser.

* * * * *